(12) United States Patent
Regev (10) Patent No.: US 7,107,391 B2
(45) Date of Patent: Sep. 12, 2006

(54) AUTOMATIC LEARNING IN A CAM

(75) Inventor: Alon Regev, Woodland Hills, CA (US)

(73) Assignee: Micron Technology, Inc., Boise, ID (US)

( * ) Notice: Subject to any disclaimer, the term of this patent is extended or adjusted under 35 U.S.C. 154(b) by 394 days.

(21) Appl. No.: 10/330,252

(22) Filed: Dec. 30, 2002

(65) Prior Publication Data

US 2004/0128455 A1    Jul. 1, 2004

(51) Int. Cl.
*G06F 12/00*    (2006.01)
(52) U.S. Cl. .................... 711/108; 711/158; 365/49
(58) Field of Classification Search ............... 711/108, 711/158; 365/49
See application file for complete search history.

(56) References Cited

U.S. PATENT DOCUMENTS

| | | | |
|---|---|---|---|
| 6,240,485 B1* | 5/2001 | Srinivasan et al. | 711/108 |
| 6,249,449 B1* | 6/2001 | Yoneda et al. | 365/49 |
| 6,393,514 B1* | 5/2002 | Khanna et al. | 711/108 |
| 6,420,990 B1* | 7/2002 | Voelkel | 341/160 |
| 6,591,331 B1* | 7/2003 | Khanna | 711/108 |
| 6,647,457 B1* | 11/2003 | Sywyk et al. | 711/108 |
| 6,809,944 B1* | 10/2004 | Regev et al. | 365/49 |
| 2004/0128438 A1* | 7/2004 | Regev et al. | 711/108 |

* cited by examiner

*Primary Examiner*—Woo H. Choi
(74) *Attorney, Agent, or Firm*—Dickstein Sharpiro Morin & Oshinsky LLP (57) ABSTRACT

A CAM array which enables a learning process to be an extension of a search process is disclosed. When a search fails to find a matching data in the CAM array, the searched data can automatically be written to a next free address without resorting to any additional search or selection processes.

32 Claims, 7 Drawing Sheets

AUTOMATIC LEARNING IN A CAM

BACKGROUND OF THE INVENTION

The invention relates to Content Addressable Memories (CAMs) and a method and apparatus for determining a Next Free Address (NFA) during a write operation.

BACKGROUND OF THE INVENTION

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data input to the device or in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., random access memory (RAM), dynamic RAM (DRAM), etc.). For example, data is stored in a RAM in a particular location, called an address. During a memory search on a RAM, the user supplies the address and gets back the data stored in that address (location).

In a CAM, however, data is stored in locations in a somewhat random fashion. The locations can be selected by an address, or the data can be written into a first empty memory location or NFA. Once information is stored in a memory location, it is found doing a memory search by comparing every bit in any memory location with every bit of data in a comparand register circuit. When the content stored in the CAM memory location does not match the data placed in the comparand register, the local match detect circuit associated with the CAM memory location returns a no-match indication. When the content stored in the CAM memory location matches the data placed in the comparand register, the local match detect circuit associated with the CAM memory location returns a match indication. If one or more of the local match detect circuits return a match indication then the CAM device outputs a match indication. If no local match detect circuits return a match indication then the CAM device outputs a no-match indication. In addition, if a match is found then the CAM returns the identification of the address location in which the matching data is stored (or one of the address locations in which matching data was stored if more than one memory location contained matching data). Thus, with a CAM, the user supplies the data and gets back an indication of an address where a matching data is stored.

In typical applications where CAMs are utilized, it is desirable to write in new data not found in a database (a so-called learning operation), wherein when the data searched for is not found as matching data in the database, the search for data is stored in an empty location in the CAM. In prior art, the learning operation in a CAM is comprised of a sequence of operations including a) a search for the data in the database; b) a new search operation specifically to find the next free address NFA, and c) a write process wherein the new "learned" data is stored at the NFA location. Consequently, a CAM array which avoids these cumbersome and time-consuming operations is desired.

BRIEF SUMMARY OF THE INVENTION

The present invention enables the learning of new data to be an extension of the search process in a CAM so that when a search fails to find matching data in the database, the search data is automatically written to a previously determined NFA without resorting to any additional processes.

In one aspect, the invention provides a CAM array having a group of memory words, where each word has an associated indicator for indicating that the memory storage location is available for data storage and an associated match line for indicating if a search word matches the contents of the memory storage locations. The indicators for the match lines are time-multiplexed to inputs of a priority encoder which during one mode of operation indicates a highest priority indicator and provides an NFA, and in another mode indicates a highest priority word match from the search. If a word search yields no matches, the search word can be stored in the previously found NFA without a need to conduct a separate NFA search.

BRIEF DESCRIPTION OF THE DRAWINGS

The above and other features of the invention will be more clearly understood from the following detailed description of the invention provided in connection with the accompanying drawings.

DETAILED DESCRIPTION OF THE INVENTION

Figure 1:
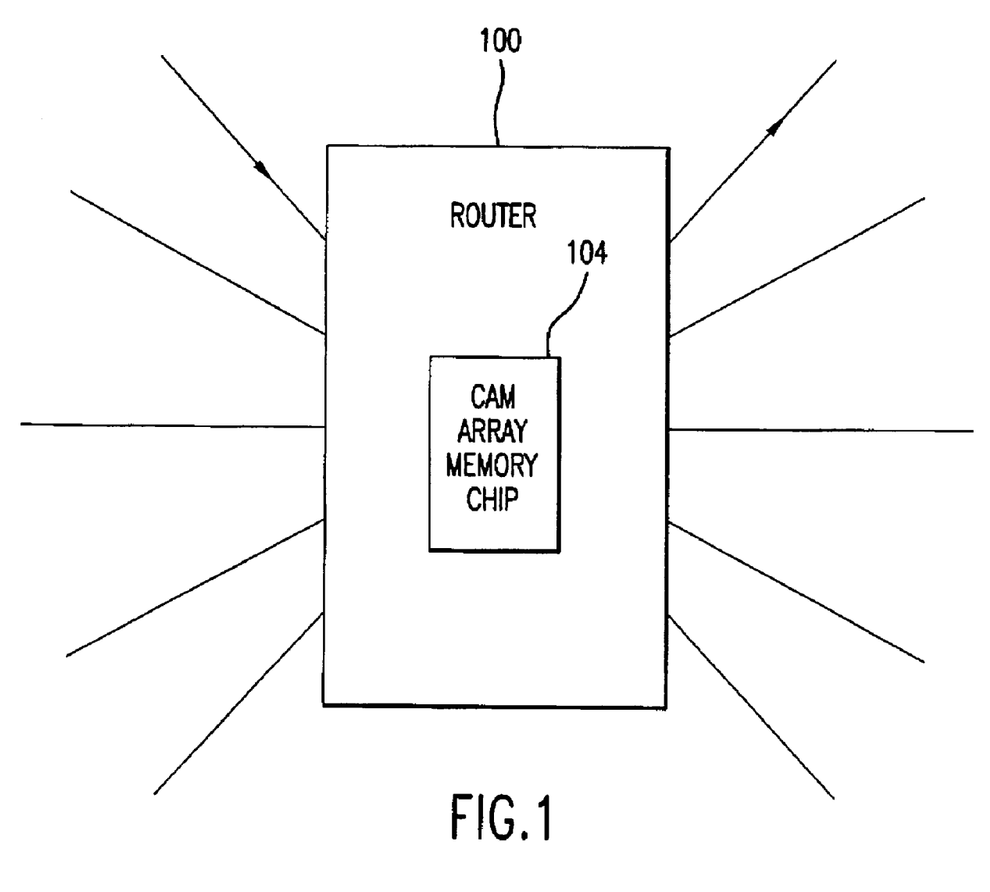
FIG. 1 depicts a simplified block diagram of a router employing a CAM array equipped with a multi-match circuit of the present invention.

FIG. 1 is a simplified block diagram of a router 100 connected to a CAM array memory chip 104 as may be used in a communications network, such as, e.g., part of the Internet backbone. The router 100 contains a plurality of input lines and a plurality of output lines. When data is transmitted from one location to another, it is sent in a form known as a packet. Oftentimes, prior to the packet reaching its final destination, that packet is first received by the router. The router 100 then decodes that part of the data identifying the ultimate destination and decides which output line and what forwarding instructions are required for the packet.

Generally, CAMs are very useful in router applications because of their ability for instantaneous search of a large database. As a result, when a packet is received by the router 100, the router may already have a table of forwarding instructions for each ultimate destination stored within its CAM. Therefore, only that portion of the packet that identifies the sender and recipient need be decoded in order to perform a search of the CAM to identify which output line and instructions are required to pass the packet onto a next node of its journey.

In many applications where CAMs are used, the data stored in the CAM is acquired by a process of learning or absorption, wherein a specific data value is searched in the CAM, and if not found, the data is stored (or learned) in the CAM for later use. To store data in the CAM, the CAM apparatus must know which location (address) in the CAM array is free, and thus may be written to. Writing data into the CAM typically requires a search for a free address, and a write operation performed to that free address. In the present invention the CAM automatically generates the Next Free Address (NFA) to which the new data is to be written as an adjunct to the searching operation. Therefore, if a search does not yield a match within the CAM, the NFA is always present, and the data in the comparand register can be written automatically to that NFA. The present invention combines the search for data with the search for an NFA, and stores the NFA in a series of latch registers so that it may be easily accessed when needed.

Figure 2:
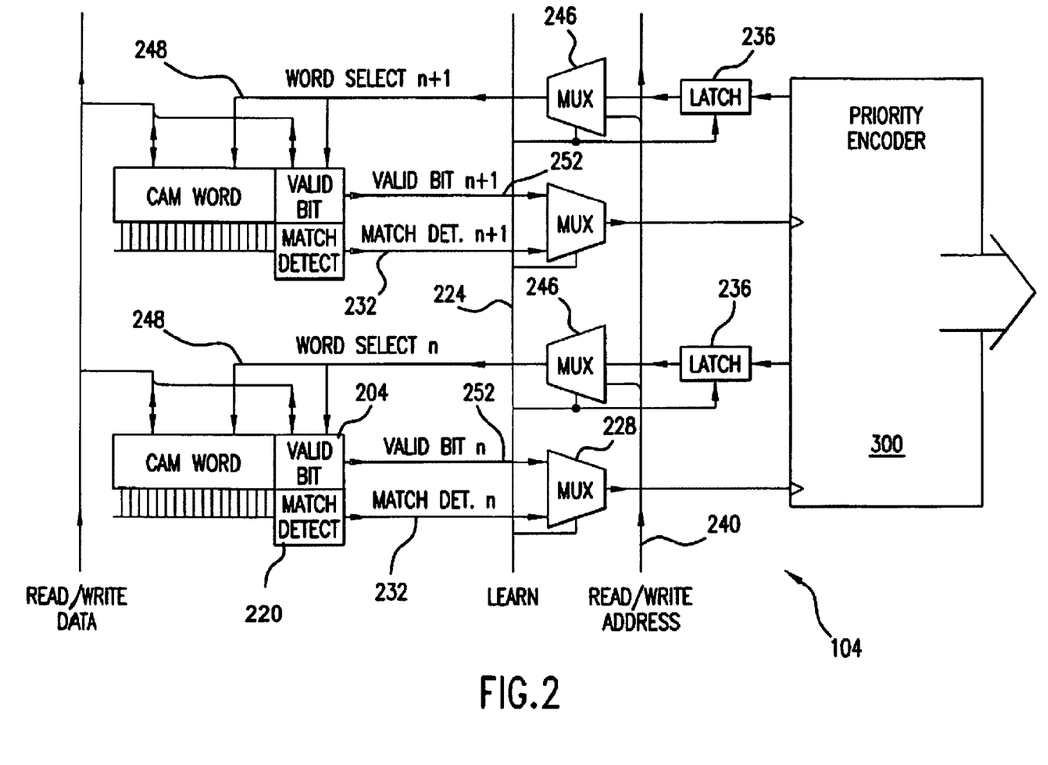
FIG. 2 shows an exemplary embodiment of the invention.

An exemplary embodiment of the CAM array 104 (FIG. 1) of the present invention is shown in FIG. 2. In the CAM array 104, a plurality of CAM words are stored in the memory array 104 at respective memory locations and each search location has an associated VALID bit 204 and a match detect circuit 220. The status of the VALID bit 204 acts as an indicator indicating whether an associated memory location is available for data storage. The VALID bit 204 is connected to a VALID line 252 while the match detect circuit 220 is connected to a match detect line 232. Both the VALID line 252 and the match detect line 232 are connected to a respective multiplexer 228 acting as a switch which selects either the valid line 252 or match detect line 232 in response to a signal on a learn line 224. The output of the multiplexer 228 is in turn connected to a respective input of a priority encoder 300. The priority encoder 300, under certain circumstances, will output results to one of a plurality of latches 236 which is in turn connected to one input of a respective multiplexer 246, while the other input of multiplexer 246 receives read/write addresses on line 240. The output of the multiplexer 246 is connected to a respective one of the plurality of CAM words by a word select line 248.

Within the CAM array 104, a search for a matching address requires two operational stages. In the first search stage, the VALID bit 204 of every location (word) in the CAM is checked. Typically, a VALID bit 204 is "1" in a CAM location holding stored valid data, and the VALID bit 204 is "0" when a location is empty or invalid. All of the VALID bits 204 are connected through respective multiplexers 228 to respective inputs of the priority encoder 300, which responds to active '0' inputs. The priority encoder 300 only responds to one highest priority active "0" input, and ignores all other active inputs. The priority encoder 300 then generates an output uniquely representing the location in the CAM array 104 of the VALID bit 204 to which the priority encoder 300 had responded at the latch 236 corresponding to the storage location produces the highest priority active input. Thus, the priority encoder 300 determines which empty storage location to write to as the NFA by storing a bit value in an associated latch 236 when more than one empty storage location is available. This information is later used when no match occurs so that the unmatching data can be "learned" or written into the CAM array 104.

In the second operational stage, search addresses of memory locations with data matching the search word in a stored comparand register are located. Data in the comparand register is simultaneously compared, bit by bit, with the data stored in every word of the CAM 104.

When a match of all the bits occurs of a specific word within the CAM 104, the match detector 228 associated with that word sets its match line 232 to "0". During any particular search, more than one of match lines 232 can be set. This is because, the comparand can contain "wild-card" or "don't-care" conditions. During the word search the priority encoder 300 operates to detect an active match line having a highest priority and provides an address of the associated memory location on an output 312. If no match line is active indicating that the search word does not match any of the words stored in the word storage locations, then the search word can be stored in the word storage location having an associated latch 236 previously set to indicate the NFA, as described in further detail below.

Figure 3:
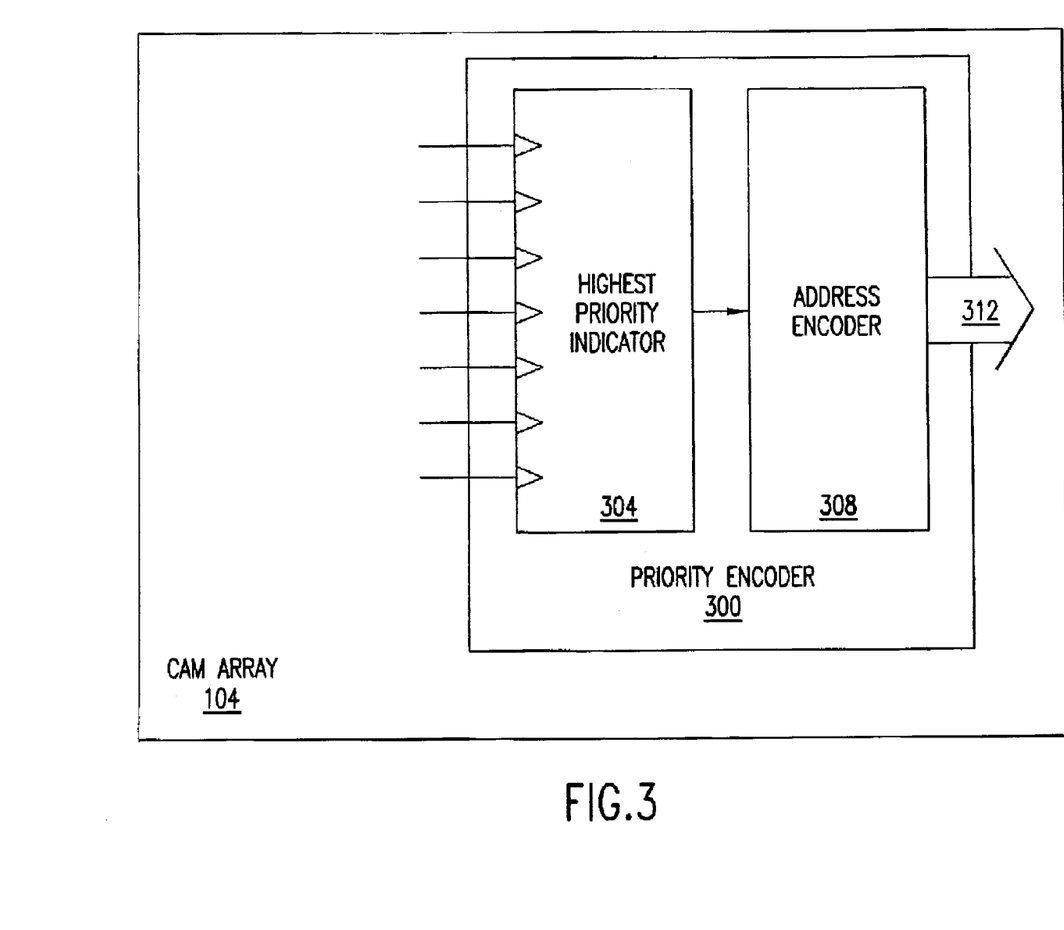
FIG. 3 is a block diagram of the priority encoder.

The priority encoder 300 is comprised of two sections, as shown in FIG. 3. The highest priority indicator 304 is followed by an address encoder 308. Every memory location match line 232 in the CAM array 104 has exactly one corresponding input into the highest priority indicator 304. Although many matches can simultaneously occur during a CAM search, the highest priority indicator 304 selects a single highest priority memory location and provides that location to an address encoder 308. Thus, the highest priority indicator 304 will always indicate the one and only highest priority location within the CAM array 104 to the address encoder 308. The address encoder 308 then outputs a corresponding address for the highest priority location as shown by the arrow 312.

Figure 4:
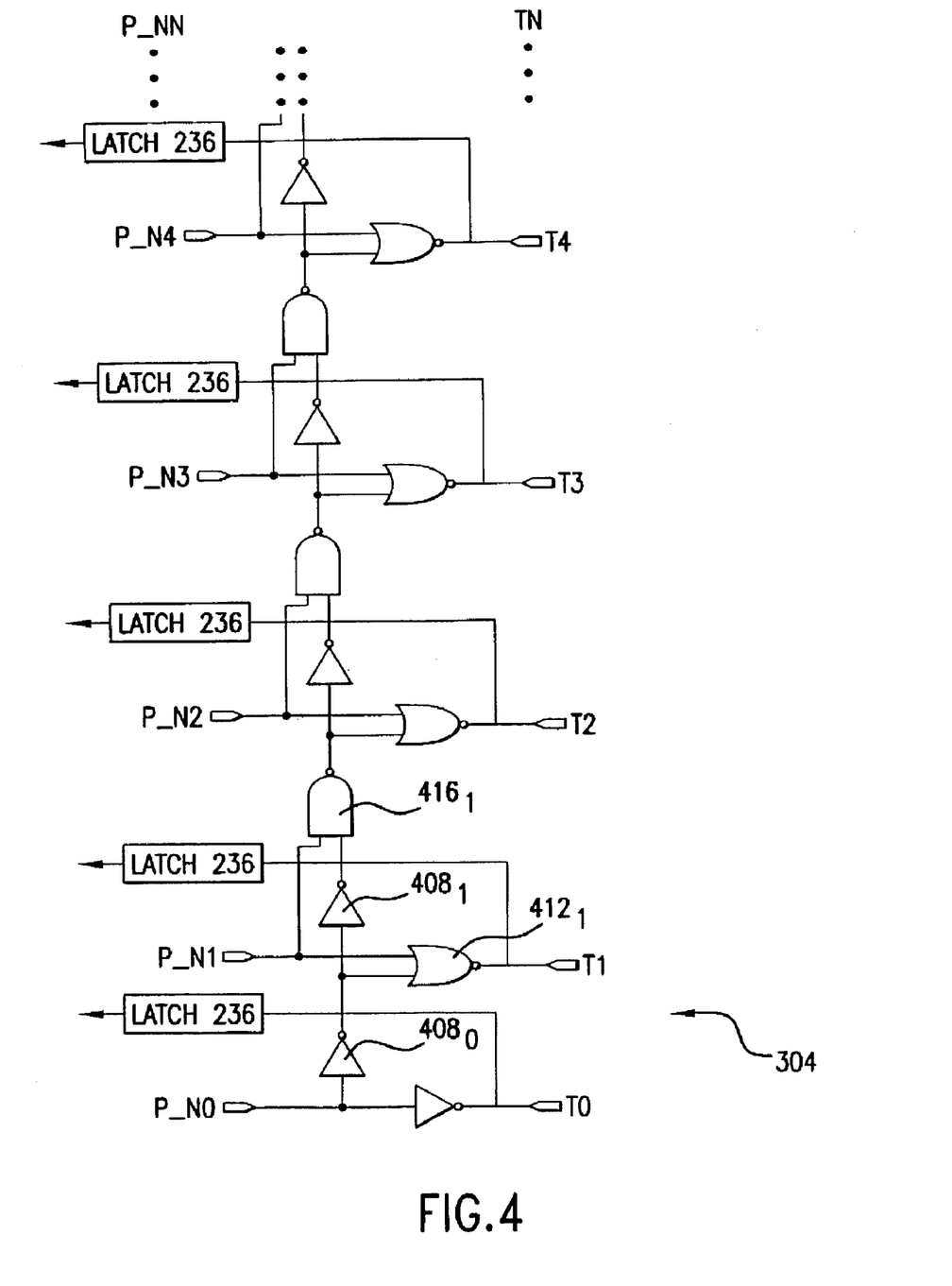
FIG. 4 is a schematic diagram of the highest priority indicator.

FIG. 4 shows an exemplary embodiment of the highest priority indicator (HPI) 304. The highest priority indicator 304 operates as follows. In an initial state, all inputs P_N0 through P_NN are at a state of "1" which is the inactive state, while all the outputs T0 through TN are in the inactive state of "0". Whenever any input P_N* goes to the active state of "0", this active input disables all the inputs above it in the chain, forcing their associated outputs to remain inactive ("0"). Only the output T* associated with this input P_N* becomes active, and goes to the state of "1". An active input on and input P_N0 will cause the output T1 of P_N1 to be inactive because of the inverter $408_0$ which feeds into the NOR gate $412_1$. Similarly, each succeeding output will be disabled partially by the NAND gates $416_{1-N}$.

Thus, the bottom of the highest priority indicator 304 has the highest priority, and the priority descends toward the top. Accordingly, input P_N0 will always have the highest priority over any other input. Therefore, if any number of inputs are simultaneously active, the highest priority indicator will activate only the output associated with the highest priority active input, leaving all other outputs inactive.

Referring back to FIG. 4, each output of the highest priority indicator 304 also connects to the D input of a respective latch 236. The latches 236 are controlled by a learn signal on the line 224. The output of every latch 236 controls the "sword select" line of the word with which it is associated via the multiplexer 246. All multiplexers 246 are controlled by the learn signal on line 224. The second input of each multiplexer 246 is connected to an address select line 240 generated by an address decoder. In word search operations where learning is not desired, the learn signal line 224 is held at a predetermined logic state, e.g., "1", as shown by the left side of the signal diagram of FIG. 7. This causes the multiplexers 228 to connect the respective match detection output lines 232 to the priority encoder 300 inputs and causes the multiplexers 246 to connect the address control lines to the respective word select lines 248. Under these conditions, the priority encoder 300 responds to signals on the match detect lines 232, and the data can be written to or read from the CAM array 104 only by the address signals supplied to the read/write address lines 240. In this state, the CAM array 104 can be read, written, or searched with a highest priority match during a search operation being detected by priority encoder 300.

Figure 5:
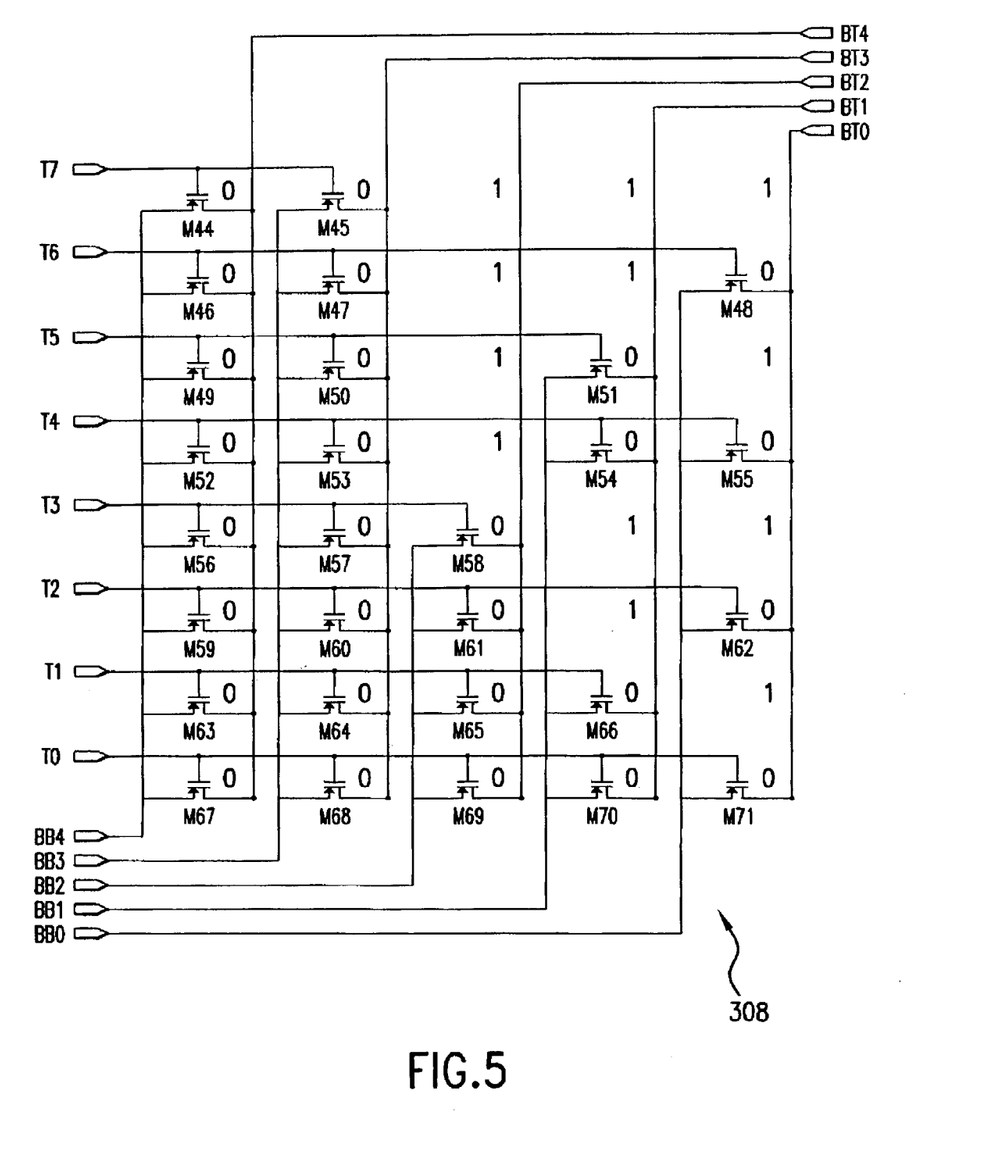
FIG. 5 is a schematic diagram of the address encoder.

Many methods are described for converting the output of the highest priority indicator 304 into an address. The simplest method is that of a look-up table, although the present invention should not be limited only to that conversion method. FIG. 5 shows an 8 bit section of a 32 bit look-up table which comprises the address encoder 308 of the present invention. The inputs BB0 through BB4 are connected to ground, and the pins marked as BT0 through BT4 are each connected to the power supply via a separate resistor and provide an output address.

The operation of the address encoder 308 will be explained with a simple example. Assume that the input T0 is "1", turning ON all the transistors M67 through M71 connected thereto. The resulting current through the turned ON transistors causes the voltage at the output pins BT0 through BT4 to go down to zero volts, thus forming the binary address output value of 00000. Now suppose instead the input T3 is active) transistors M56–58 would be enabled so that only the outputs BT2, BT3, and BT4 are pulled to 0 volts, while BT0 and BT1 remain high. Thus the binary address value 00011 is present on the output pins BT0 through BT4.

Figure 7:
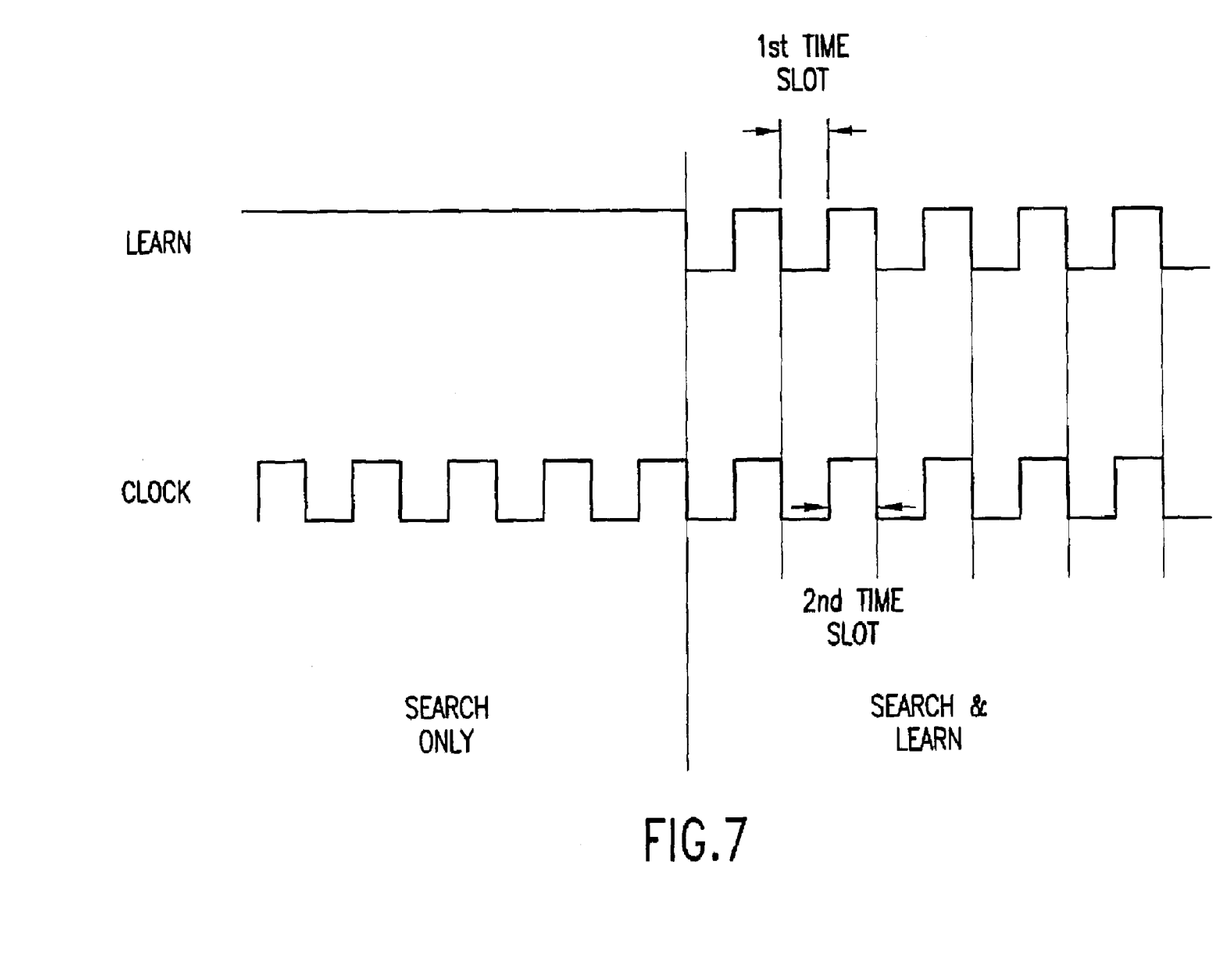
FIG. 7 shows the patterns of the learn signal in a normal search compared with a search and learn operation.

When a search is desired in which a learning process will augment a search operation, the LEARN signal 224 toggled periodically between a "1" and "0" state, as shown in the right side of the FIG. 7 signal timing diagram, at the system clock rate. Each learn/search period is divided into two alternating time slots. In the first time slot the learn signal 224 has a "0" signal state, causing the multiplexers 228 to connect the respective VALID lines 252 to the priority encoder 300, setting the latches 236 to a transparent mode where data is not latched, and causing the multiplexers 244 to connect the outputs of the latches 236 to respective word select lines 248. As mentioned above, all the outputs of the highest priority indicator 304 are normally "0", and only a single highest priority output line becomes "1" in response to any number of inputs to the highest priority indicator 304 being "0". Also, as mentioned above, when a word in the CAM array 104 is available in storage, its VALID bit output 252 is "0". Therefore, during the time when the learn signal 224 is "0", the highest priority indicator 304 identifies the highest priority empty word in the CAM array 104. Upon the transition of the learn signal 224 from "0" to "1", the latches 236 transition from the transparent state to the hold state, and keep the single "1" output generated by the highest priority indicator 304 unchanged. In the time slot when the learn signal is "1", the multiplexers 228 also connects the outputs of the match detection circuits 232 to respective inputs of the priority encoder 300, and a "normal" search of the CAM array 104 ensues.

It is possible that no match will be detected during the search operation, in such case the search process is immediately followed by a write process by which data in the comparand register is written to the memory location where the output of the latch 236 is "1". By doing so, the CAM has thus "learned" that data. In addition, the status of the VALID bit 204 in the associated memory location is charged from "0" to "1" indicating that the memory location is no longer available for storage.

Figure 6:
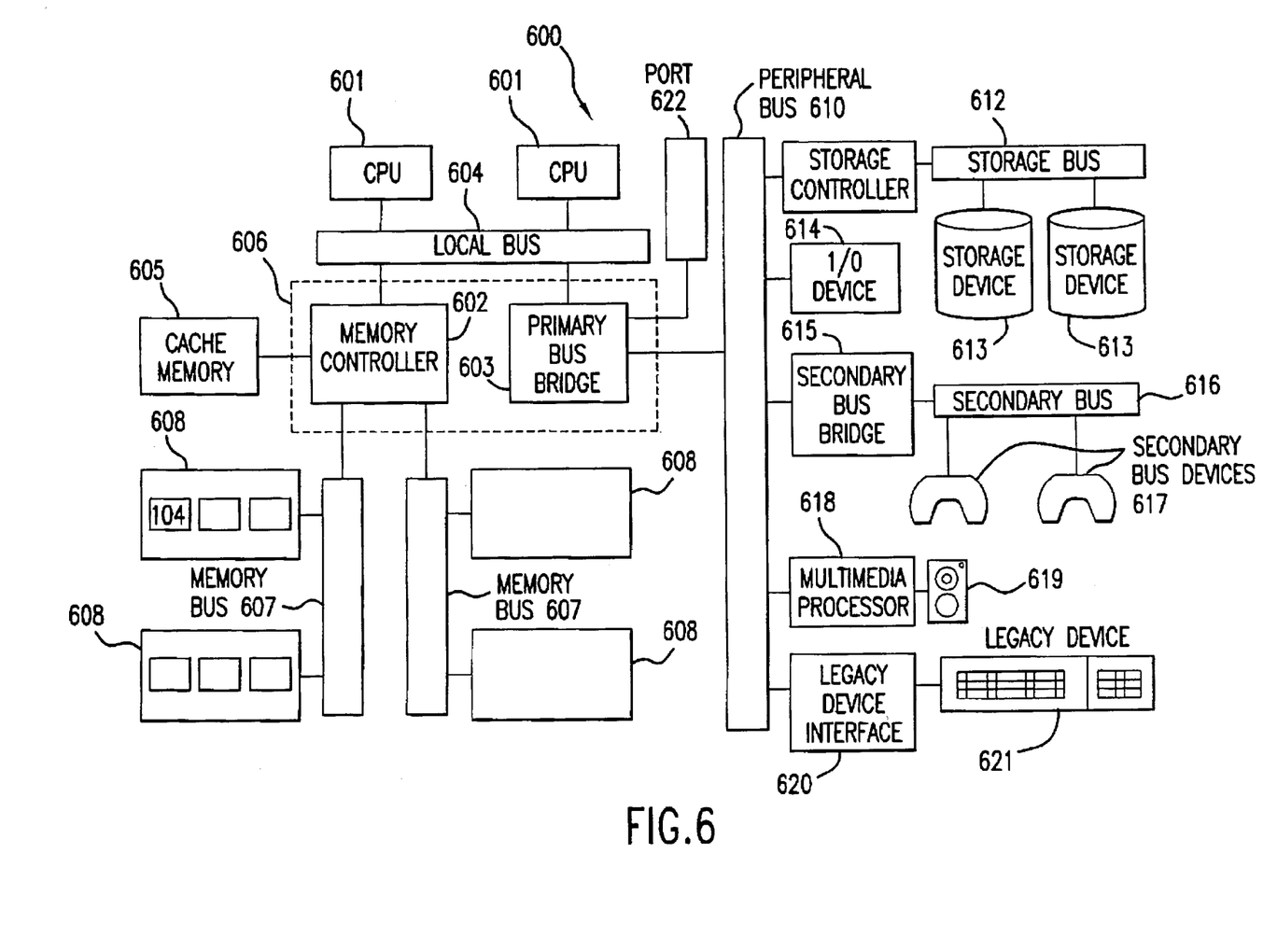
FIG. 6 shows use of a CAM in accordance with the present invention used within a processor system.

The CAM memory system of the present invention may be employed in any system where CAMs are typically used, such as the router depicted in FIG. 1, or in any processor-based memory system. FIG. 6 illustrates an exemplary processing system 600 which utilizes the CAM array 104 of the present invention. The processing system 600 includes one or more processors 601 coupled to a local bus 604. A memory controller 602 and a primary bus bridge 603 are also coupled the local bus 604. The processing system 600 may include multiple memory controllers 602 and/or multiple primary bus bridges 603. The memory controller 602 and the primary bus bridge 603 may be integrated as a single device 606.

The memory controller 602 is also coupled to one or more memory buses 607. Each memory bus accepts memory components 608. Any one of memory components 608 may contain a CAM array containing a match detection circuit such as the CAM arrays 104 of the present invention.

The memory components 608 may be a memory card or a memory module. The memory components 608 may include one or more additional devices 609. For example, in a SIMM or DIMM, the additional device 609 might be a configuration memory, such as a serial presence detect (SPD) memory. The memory controller 602 may also be coupled to a cache memory 605. The cache memory 605 may be the only cache memory in the processing system. Alternatively, other devices, for example, processors 601 may also include cache memories, which may form a cache hierarchy with cache memory 605. If the processing system 600 include peripherals or controllers which are bus masters or which support direct memory access (DMA), the memory controller 602 may implement a cache coherency protocol. If the memory controller 602 is coupled to a plurality of memory buses 607, each memory bus 607 may be operated in parallel, or different address ranges may be mapped to different memory buses 607.

The primary bus bridge 603 is coupled to at least one peripheral bus 610. Various devices, such as peripherals or additional bus bridges may be coupled to the peripheral bus 610. These devices may include a storage controller 611, an miscellaneous I/O device 614, a secondary bus bridge 615, a multimedia processor 618, and an legacy device interface 620. The primary bus bridge 603 may also coupled to one or more special purpose high speed ports 622. In a personal computer, for example, the special purpose port might be the Accelerated Graphics Port (AGP), used to couple a high performance video card to the processing system 600.

The storage controller 611 couples one or more storage devices 613, via a storage bus 612, to the peripheral bus 610. For example, the storage controller 611 may be a SCSI controller and storage devices 613 may be SCSI discs. The I/O device 614 may be any sort of peripheral. For example, the I/O device 614 may be an local area network interface, such as an Ethernet card. The secondary bus bridge may be used to interface additional devices via another bus to the processing system. For example, the secondary bus bridge may be an universal serial port (USB) controller used to couple USB devices 617 via to the processing system 600. The multimedia processor 618 may be a sound card, a video capture card, or any other type of media interface, which may also be coupled to one additional devices such as speakers 619. The legacy device interface 620 is used to couple legacy devices, for example, older styled keyboards and mice, to the processing system 600.

The processing system 600 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 600 to become more suitable for use in a variety of applications. For example, many electronic devices which require processing may be implemented using a simpler architecture which relies on a CPU 601 coupled to memory components 608 and/or memory devices 609. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A content addressable memory, comprising:
    a plurality of memory storage locations, each having an associated indicator for indicating that the memory storage location is available for data storage and an associated match line for indicating if a search word matches a word stored in the memory storage location;
    a first selection circuit for selecting the match lines associated with each of said plurality of memory storage locations during a first mode and for selecting the indicators associated with each of said plurality of memory storage locations during a second mode;
    a priority encoder having a plurality of inputs and operable in the first mode where said first selection circuit respectively couples said match lines to said plurality of inputs to indicate a priority match on said match lines and in the second mode where said first selection circuit respectively couples said indicators to said plurality of inputs to indicate a priority storage location available for data storage, wherein said priority encoder comprises a highest priority indicator circuit having said plurality of inputs and a plurality of outputs, one of said outputs being active at a time to indicate a highest priority of signals present at said inputs;
    a second selection circuit for selecting one of said memory storage locations for a memory operation in response to a selected first selection signal associated with an output of the priority encoder or a second selection signal associated with a read/write address; and
    a plurality of latch circuits respectively coupled to the outputs of said highest priority indicator circuit, said plurality of latch circuits being selectively operable when said priority encoder is in said second mode to latch an indication of a highest priority memory storage location which is available for data storage, said latches respectively supplying said first selection signals for the associated memory storage locations.

2. A content addressable memory as in claim 1 wherein said priority encoder is a highest priority encoder.

3. The content addressable memory of claim 1, further comprising:
    a third selection signal having a first state for operating said first and second selection circuits such that when said match lines are coupled to said priority encoder inputs said first selection signals are not operative to select a memory storage location.

4. The content addressable memory of claim 3, wherein said third selection signal has a second state for operating said first and second selection circuit such that when said indicators are coupled to said priority encoder inputs said latches latch an indication of a highest priority storage location which is available for data storage.

5. The content addressable memory of claim 4, wherein said third selection signal first state causes said second selection circuit to provide address signals for a memory access operation to respective memory storage locations.

6. The content addressable memory of claim 4, wherein said third selection signal causes said second selection circuit to provide said latch signals to select a memory storage location.

7. The content addressable memory of claim 6, wherein said latch signals cause an available highest priority memory storage location to be available for storage of a memory search word.

8. The content addressable memory of claim 6, wherein use of said latch signals to select a memory storage location causes an indicator associated with memory storage to no longer indicate that it is available for data storage.

9. The content addressable memory of claim 1, wherein said indicator is a stored bit.

10. The content addressable memory claim 1, wherein said priority encoder further comprises an address encoder for indicating an address associated with a highest priority output of said highest priority indicator circuit.

11. A router, comprising:
    a plurality of message receiving inputs;
    a plurality of message transmitting outputs; and
    a semiconductor chip containing a content addressable memory, said content addressable memory being used to route messages on said inputs to said outputs, said content addressable memory comprising:
    a plurality of memory storage locations, each having an associated indicator for indicating that the memory storage location is available for data storage and an associated match line for indicating if a search word matches a word stored in the memory storage location;
    a first selection circuit for selecting the match lines associated with each of said plurality of memory storage locations during a first mode and for selecting the indicators associated with each of said plurality of memory storage locations during a second mode;
    a priority encoder having a plurality of inputs and operable in the first mode where said first selection circuit respectively couples said match lines to said plurality of inputs to indicate a priority match on said match lines and in the second mode where said first selection circuit respectively couples said indicators to said plurality of inputs to indicate a priority storage location available for data storage;
    a second selection circuit for selecting one of said memory storage locations for a memory operation in response to a selected first selection signal associated with an output of the priority encoder or a second selection signal associated with a read/write address; and
    a plurality of latch circuits respectively coupled to the outputs of said highest priority indicator circuit, said plurality of latch circuits being selectively operable when said priority encoder is in said second mode to latch an indication of a highest priority memory storage location which is available for data storage, said latches respectively supplying said first selection signals for the associated memory storage locations.

12. The router as in claim 11 wherein said priority encoder is a highest priority encoder.

13. The router of claim 11, wherein said priority encoder comprises a highest priority indicator circuit having said plurality of inputs and a plurality of outputs, one of said outputs being active at a time to indicate a highest priority of signals present at said inputs.

14. The router of claim 11, further comprising:
a third selection signal having a first state for operating said first and second selection circuits such that when said match lines are coupled to said priority encoder inputs said first selection signals are not operative to select a memory storage location.

15. The router of claim 14, wherein said third selection signal has a second state for operating said first and second selection circuit such that when said indicators are coupled to said priority encoder inputs said latches latch an indication of a highest priority storage location which is available for data storage.

16. The router of claim 15, wherein said third selection signal first state causes said second selection circuit to provide address signals for a memory access operation to respective memory storage locations.

17. The router of claim 15, wherein said third selection signal causes said second selection circuit to provide said latch signals to select a memory storage location.

18. The router of claim 17, wherein said latch signals cause an available highest priority memory storage location to be available for storage of a memory search word.

19. The router of claim 17, wherein use of said latch signals to select a memory storage location causes an indicator associated with memory storage to no longer indicate that it is available for data storage.

20. The router of claim 11, wherein said indicator is a stored bit.

21. The router of claim 11, wherein said priority encoder further comprises an address encoder for indicating an address associated with a highest priority output of said highest priority indicator circuit.

22. A processor circuit, comprising
a processor; and
a content-addressable memory circuit for exchanging data with said processor, said content addressable memory circuit comprising:
a plurality of memory storage locations, each having an associated indicator for indicating that the memory storage location is available for data storage and an associated match line for indicating if a search word matches a word stored in the memory storage location;
a first selection circuit for selecting the match lines associated with each of said plurality of memory storage locations during a first mode and for selecting the indicators associated with each of said plurality of memory storage locations during a second mode;
a priority encoder having a plurality of inputs and operable in the first mode where said first selection circuit respectively couples said match lines to said plurality of inputs to indicate a priority match on said match lines and in the second mode where said first selection circuit respectively couples said indicators to said plurality of inputs to indicate a priority storage location available for data storage;
a second selection circuit for selecting one of said memory storage locations for a memory operation in response to a selected first selection signal associated with an output of the priority encoder or a second selection signal associated with a read/write address; and
a plurality of latch circuits respectively coupled to the outputs of said highest priority indicator circuit, said plurality of latch circuits being selectively operable when said priority encoder is in said second mode to latch an indication of a highest priority memory storage location which is available for data storage, said latches respectively supplying said first selection signals for the associated memory storage locations.

23. A processor circuit as in claim 22 wherein said priority encoder is a highest priority encoder.

24. The processor circuit of claim 23, wherein said priority encoder comprises a highest priority indicator circuit having said plurality of inputs and a plurality of outputs, one of said outputs being active at a time to indicate a highest priority of signals present at said inputs.

25. The processor circuit claim 23, wherein said priority encoder further comprises an address encoder for indicating an address associated with a highest priority output of said highest priority indicator circuit.

26. The processor circuit of claim 22, further comprising:
a third selection signal having a first state for operating said first and second selection circuits such that when said match lines are coupled to said priority encoder inputs said first selection signals are not operative to select a memory storage location.

27. The processor circuit of claim 26, wherein said third selection signal has a second state for operating said first and second selection circuit such that when said indicators are coupled to said priority encoder inputs said latches latch an indication of a highest priority storage location which is available for data storage.

28. The processor circuit of claim 27, wherein said third selection signal first state causes said second selection circuit to provide address signals for a memory access operation to respective memory storage locations.

29. The processor circuit of claim 27, wherein said third selection signal causes said second selection circuit to provide said latch signals to select a memory storage location.

30. The processor circuit of claim 29, wherein said latch signals cause an available highest priority memory storage location to be available for storage of a memory search word.

31. The processor circuit of claim 29, wherein use of said latch signals to select a memory storage location causes an indicator associated with memory storage to no longer indicate that it is available for data storage.

32. The processor circuit of claim 22, wherein said indicator is a stored bit.

* * * * *